(12) United States Patent
Hsiao

(10) Patent No.: US 11,832,432 B2
(45) Date of Patent: Nov. 28, 2023

(54) METHOD OF MANUFACTURING MEMORY DEVICE HAVING WORD LINES WITH REDUCED LEAKAGE

(71) Applicant: NANYA TECHNOLOGY CORPORATION, New Taipei (TW)

(72) Inventor: Chuan-Lin Hsiao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 112 days.

(21) Appl. No.: 17/552,736

(22) Filed: Dec. 16, 2021

(65) Prior Publication Data
US 2023/0200044 A1 Jun. 22, 2023

(51) Int. Cl.
*H10B 12/00* (2023.01)

(52) U.S. Cl.
CPC ........... *H10B 12/053* (2023.02); *H10B 12/34* (2023.02)

(58) Field of Classification Search
None
See application file for complete search history.

(56) References Cited

U.S. PATENT DOCUMENTS

| | | |
|---|---|---|
| 9,704,988 B2 | 7/2017 | Oh |
| 10,497,704 B2 | 12/2019 | Lin et al. |
| 2018/0174845 A1* | 6/2018 | Jang ................... H01L 29/4966 |
| 2019/0067278 A1 | 2/2019 | Seo et al. |

FOREIGN PATENT DOCUMENTS

| | | |
|---|---|---|
| TW | 201715702 A | 5/2017 |
| TW | 201906089 A | 2/2019 |
| TW | 202141759 A | 11/2021 |

OTHER PUBLICATIONS

Office Action dated Feb. 1, 2023 related to Taiwanese Application No. 111107763.

* cited by examiner

*Primary Examiner* — Hsien Ming Lee
(74) *Attorney, Agent, or Firm* — Xuan Zhang

(57) ABSTRACT

The present application provides a method of manufacturing a memory device having several word lines (WL) with reduced leakage. The method includes steps of providing a semiconductor substrate defined with an active area and including an isolation surrounding the active area; forming a first recess extending into the semiconductor substrate and across the active area; forming a first lining portion of a first insulating layer conformal to the first recess; disposing a first conductive material conformal to the first lining portion; forming a first conductive member surrounded by the first conductive material; disposing a second conductive material over the first conductive member to form a first conductive layer enclosing the first conductive member; and forming a first protruding portion of the first insulating layer above the first conductive layer and the first conductive member.

19 Claims, 20 Drawing Sheets

METHOD OF MANUFACTURING MEMORY DEVICE HAVING WORD LINES WITH REDUCED LEAKAGE

TECHNICAL FIELD

The present disclosure relates to a memory device and a manufacturing method thereof, and more particularly, to a memory device having several word lines (WL) with reduced leakage and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, current leakage may occur. The leakage may result in a significant drop in performance of the cell transistors. It is therefore desirable to develop improvements that address related manufacturing challenges.

SUMMARY

One aspect of the present disclosure provides a memory device. The memory device includes a semiconductor substrate defined with an active area and including a recess extending into the semiconductor substrate; and a word line disposed within the recess, wherein the word line includes an insulating layer disposed within the recess, a conductive layer surrounded by the insulating layer, and a conductive member enclosed by the conductive layer, and the insulating layer includes a lining portion conformal to the recess and a protruding portion disposed above the conductive layer.

In some embodiments, a top surface of the lining portion and a top surface of the protruding portion are exposed through the semiconductor substrate.

In some embodiments, the protruding portion is in contact with a top surface of the conductive layer.

In some embodiments, the protruding portion is disposed above the conductive member.

In some embodiments, the lining portion and the protruding portion include a same material.

In some embodiments, the lining portion and the protruding portion are integrally formed.

In some embodiments, the insulating layer includes oxide.

In some embodiments, the conductive layer includes titanium nitride (TiN).

In some embodiments, the conductive member includes tungsten (W).

In some embodiments, the word line includes a work function member disposed over the conductive layer and the conductive member, and a gate insulating member disposed over the work function member.

In some embodiments, the work function member and the gate insulating member are surrounded by the insulating layer.

In some embodiments, the work function member and the gate insulating member are in contact with the protruding portion.

In some embodiments, a total width of the conductive layer and the conductive member is substantially equal to a total width of the protruding portion and the work function member.

In some embodiments, a total width of the conductive layer and the conductive member is substantially equal to a total width of the protruding portion and the gate insulating member.

In some embodiments, the work function member includes polysilicon.

In some embodiments, the gate insulating member includes nitride.

Another aspect of the present disclosure provides a memory device. The memory device includes a semiconductor substrate defined with an active area and including a first recess extending into the semiconductor substrate; and a word line disposed within the first recess, wherein the word line includes a first insulating layer disposed within the first recess, a first conductive layer surrounded by the first insulating layer, and a first conductive member enclosed by the first conductive layer, and the first insulating layer is at least partially disposed above the first conductive layer.

In some embodiments, the first insulating layer is in contact with a top surface of the first conductive layer.

In some embodiments, a width of the first insulating layer above the first conductive layer is substantially greater than a width of the first insulating layer surrounding the first conductive layer and the first conductive member.

In some embodiments, the memory device further includes an isolation structure adjacent to the word line and extending into the semiconductor substrate, a second conductive layer surrounded by the isolation structure, and a second conductive member enclosed by the second conductive layer.

In some embodiments, a width of the isolation structure above the second conductive layer is substantially greater than a width of the isolation structure surrounding the second conductive layer and the second conductive member.

In some embodiments, the second conductive layer includes titanium nitride (TiN).

In some embodiments, the second conductive member includes tungsten (W).

In some embodiments, the first conductive layer and the second conductive layer include a same material.

In some embodiments, the first conductive member and the second conductive member include a same material.

Another aspect of the present disclosure provides a method of manufacturing a memory device. The method includes steps of providing a semiconductor substrate defined with an active area and including an isolation surrounding the active area; forming a first recess extending into the semiconductor substrate and across the active area; forming a first lining portion of a first insulating layer conformal to the first recess; disposing a first conductive material conformal to the first lining portion; forming a first conductive member surrounded by the first conductive material; disposing a second conductive material over the first conductive member to form a first conductive layer enclosing the first conductive member; and forming a first protruding portion of the first insulating layer above the first conductive layer and the first conductive member.

In some embodiments, the formation of the first lining portion is performed prior to the formation of the first protruding portion.

In some embodiments, the method further includes removing a portion of the first conductive material disposed above the first conductive member after the disposing of the second conductive material.

In some embodiments, the formation of the first protruding portion includes disposing an insulating material over the semiconductor substrate, the first lining portion, the first conductive layer and the first conductive member.

In some embodiments, the insulating material is disposed by atomic layer deposition (ALD).

In some embodiments, the formation of the first protruding portion includes removing a portion of the insulating material disposed over the semiconductor substrate and the first lining portion.

In some embodiments, the portion of the insulating material is removed by anisotropic etching.

In some embodiments, the method further includes forming a second recess extending into the isolation to form a second lining portion of an isolation structure; forming a second conductive layer surrounded by the second lining portion; forming a second conductive member enclosed by the second conductive layer; and forming a second protruding portion of the isolation structure above the second conductive layer and the second conductive member.

In some embodiments, the first protruding portion and the second protruding portion are formed simultaneously.

In some embodiments, the method further includes forming a first work function member over the first conductive layer and surrounded by the first protruding portion; and forming a first gate insulating member over the first work function member and surrounded by the first protruding portion.

In conclusion, because an insulating layer of a word line surrounding a work function member has a greater thickness compared to the insulating layer surrounding a conductive member under the work function member, a gate-induced drain leakage (GIDL) can be suppressed. Further, the insulating layer surrounding the conductive member has a smaller thickness and thus can improve a control of an operation of the word line. Therefore, performance of the memory device and process of manufacturing of the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
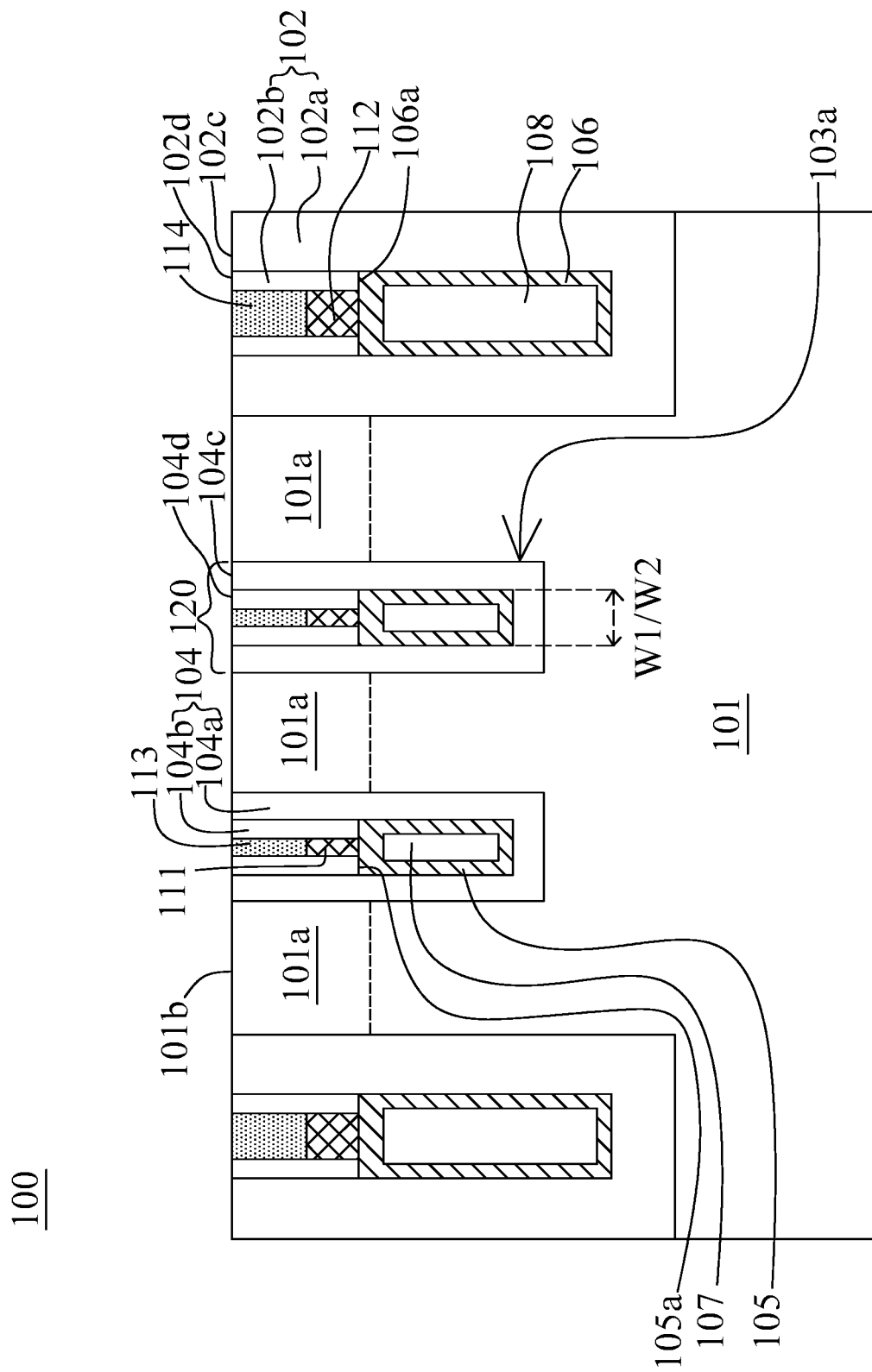
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a memory device 100 in accordance with some embodiments of the present disclosure. In some embodiments, the memory device 100 includes several unit cells arranged in rows and columns.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes several active areas (AA) 101a. The active area 101a is a doped region in the semiconductor substrate 101. In some embodiments, the active area 101a extends horizontally over or under a top surface of the semiconductor substrate 101. In some embodiments, each of the active areas 101a includes a same type of dopant. In some embodiments, each of the active areas 101a includes a type of dopant that is different from the types of dopants included in other active areas 101a. In some embodiments, each of the active areas 101a has a same conductive type. In some embodiments, the active area 101a includes N-type dopants.

In some embodiments, the semiconductor substrate 101 includes a first surface 101b and a second surface 101c opposite to the first surface 101b. In some embodiments, the first surface 101b is a front side of the semiconductor substrate 101, wherein electrical devices or components are subsequently formed over the first surface 101b and configured to electrically connect to an external circuitry. In some embodiments, the second surface 101c is a back side of the semiconductor substrate 101, where electrical devices or components are absent.

In some embodiments, the semiconductor substrate 101 includes a recess 103a extending into the semiconductor substrate 101. In some embodiments, the recess 103a extends from the first surface 101b toward the second surface 101c of the semiconductor substrate 101. In some embodiments, the recess 103a is tapered from the first surface 101b toward the second surface 101c of the semiconductor substrate 101. In some embodiments, a depth of the recess 103a is substantially greater than a depth of the active area 101a.

In some embodiments, the memory device 100 includes a word line 120 disposed within the recess 103a. In some embodiments, the word line 120 includes a first insulating layer 104, a first conductive layer 105 and a first conductive member 107. In some embodiments, the first insulating layer 104 is disposed conformal to and within the recess 103a. In some embodiments, the first conductive layer 105 is surrounded by the first insulating layer 104. In some embodiments, the first conductive member 107 is enclosed by the first conductive layer 105.

In some embodiments, the first insulating layer 104 is disposed along an entire sidewall of the recess 103a. In some embodiments, the first insulating layer 104 includes dielectric material such as oxide. In some embodiments, the first insulating layer 104 is formed of an insulating material, such as silicon oxide, silicon nitride, silicon oxynitride, the like, or a combination thereof. In some embodiments, the first insulating layer 104 includes dielectric material with a low dielectric constant (low k).

In some embodiments, the first insulating layer 104 includes a first lining portion 104a conformal to the recess 103a and a first protruding portion 104b disposed above the first conductive layer 105. In some embodiments, the first lining portion 104a is disposed along the entire sidewall of the recess 103a. In some embodiments, the first lining portion 104a is coupled to the first protruding portion 104b. In some embodiments, the first protruding portion 104b protrudes from the first lining portion 104a.

In some embodiments, a thickness of the first protruding portion 104b is in a range of about 2 μm to about 3 μm. In some embodiments, the first protruding portion 104b includes low-k dielectric material. In some embodiments, the first lining portion 104a is in a range of about 4 μm to 6 μm. In some embodiments, the thickness of the first lining portion 104a is substantially greater than the thickness of the first protruding portion 104b.

In some embodiments, a top surface 104c of the first lining portion 104a and a top surface 104d of the first protruding portion 104b are exposed through the semiconductor substrate 101. In some embodiments, the first lining portion 104a and the first protruding portion 104b include a same material or different materials. In some embodiments, the first lining portion 104a and the first protruding portion 104b are integrally formed.

In some embodiments, the first conductive layer 105 is disposed within the recess 103a and surrounded by the first insulating layer 104. In some embodiments, the first conductive layer 105 is surrounded by the first lining portion 104a and is disposed under the first protruding portion 104b. In some embodiments, a top surface 105a of the first conductive layer 105 is in contact with the first protruding portion 104b. In some embodiments, the top surface 105a of the first conductive layer 105 is substantially lower than the top surface 104c of the first lining portion 104a and the top surface 104d of the first protruding portion 104b. In some embodiments, the first conductive layer 105 includes conductive material such as titanium nitride (TiN).

In some embodiments, the first conductive member 107 is disposed within the first conductive layer 105. The first conductive member 107 is surrounded by the first lining portion 104a. In some embodiments, the first conductive member 107 is disposed under the active area 101a of the semiconductor substrate 101. In some embodiments, the first protruding portion 104b is disposed above the first conductive member 107. In some embodiments, the first conductive member 107 includes conductive material such as tungsten (W).

In some embodiments, the word line 120 further includes a first work function member 111 disposed over the first conductive layer 105 and the first conductive member 107, and a first gate insulating member 113 disposed over the first work function member 111. In some embodiments, the first work function member 111 and the first gate insulating member 113 are surrounded by the first insulating layer 104. In some embodiments, the first work function member 111 and the first gate insulating member 113 are surrounded by and in contact with the first protruding portion 104b. In some embodiments, the first work function member 111 is in contact with the top surface 105a of the first conductive layer 105.

In some embodiments, a total width W1 of the first conductive layer 105 and the first conductive member 107 is substantially equal to a total width W2 of the first protruding portion 104b and the first work function member 111. In some embodiments, the total width W1 is substantially equal to the total width W2 of the first protruding portion 104b and the first gate insulating member 113. In some embodiments, the first work function member 111 includes polysilicon or polycrystalline silicon. In some embodiments, the first work function member 111 has a low work function. In some embodiments, the first work function member 111 has dual work functions and includes metal and polysilicon. In some embodiments, the first work function member 111 serves as a gate electrode.

In some embodiments, the first gate insulating member 113 includes dielectric material such as nitride. In some embodiments, the first gate insulating member 113 serves as a gate dielectric. In some embodiments, a top surface of the first gate insulating member 113 is substantially coplanar with the top surface 104c of the first lining portion 104a and the top surface 104d of the first protruding portion 104b.

In some embodiments, the memory device 100 further includes an isolation structure 102 adjacent to the word line 120. In some embodiments, the isolation structure 102 extends into the semiconductor substrate 101 from the first surface 101b toward the second surface 101c. In some embodiments, the isolation structure 102 is a shallow trench isolation (STI). In some embodiments, the isolation structure 102 defines a boundary of the active area 101*a*.

In some embodiments, the isolation structure 102 includes a second lining portion 102*a* and a second protruding portion 102*b* laterally protruding from the second lining portion 102*a*. In some embodiments, a thickness of the second protruding portion 102*b* is in a range of about 2 μm to about 3 μm. In some embodiments, the second lining portion 102*a* and the second protruding portion 102*b* include a same material or different materials. In some embodiments, the second lining portion 102*a* and the second protruding portion 102*b* are integrally formed.

In some embodiments, the isolation structure 102 is formed of an insulating material, such as silicon oxide, silicon nitride, silicon oxynitride, the like, or a combination thereof. In some embodiments, the isolation structure 102 and the first insulating layer 104 include a same material or different materials. In some embodiments, a width of the isolation structure 102 is substantially greater than a width of the word line 120. In some embodiments, a depth of the isolation structure 102 is substantially greater than a depth of the word line 120.

In some embodiments, a second conductive layer 106 and a second conductive member 108 are surrounded by the second lining portion 102*a* of the isolation structure 102. In some embodiments, the second conductive member 108 is enclosed by the second conductive layer 106. In some embodiments, the second conductive layer 106 and the second conductive member 108 are disposed under the second protruding portion 102*b*. In some embodiments, the second protruding portion 102*b* is in contact with the second conductive layer 106.

In some embodiments, the second conductive layer 106 includes conductive material such as titanium nitride (TiN). In some embodiments, the second conductive member 108 includes conductive material such as tungsten (W). In some embodiments, the first conductive layer 105 and the second conductive layer 106 include a same material or different materials. In some embodiments, the first conductive member 107 and the second conductive member 108 include a same material or different materials.

In some embodiments, a second work function member 112 is disposed over the second conductive layer 106 and the second conductive member 108, and a second gate insulating member 114 is disposed over the second work function member 112. In some embodiments, the second work function member 112 and the second gate insulating member 114 are surrounded by the isolation structure 102. In some embodiments, the second work function member 112 and the second gate insulating member 114 are surrounded by and in contact with the second protruding portion 102*b*. In some embodiments, the second work function member 112 is in contact with a top surface 106*a* of the second conductive layer 106.

In some embodiments, the second work function member 112 includes polysilicon or polycrystalline silicon. In some embodiments, the second work function member 112 has a low work function. In some embodiments, the second work function member 112 has dual work functions and includes metal and polysilicon. In some embodiments, the second gate insulating member 114 includes dielectric material such as nitride.

In some embodiments, the first work function member 111 and the second work function member 112 include a same material or different materials. In some embodiments, the first gate insulating member 113 and the second gate insulating member 114 include a same material or different materials. In some embodiments, a top surface of the second gate insulating member 114 is substantially coplanar with a top surface 102*c* of the second lining portion 102*a* and a top surface 102*d* of the second protruding portion 102*b*.

Since the first insulating layer 104 of the word line 120 surrounding the first work function member 111 has a greater thickness compared to the first insulating layer 104 surrounding the first conductive layer 105 and the first conductive member 107 under the first work function member 111, a gate-induced drain leakage (GIDL) can be suppressed. Further, the first insulating layer 104 surrounding the first conductive layer 105 and the first conductive member 107 has a smaller thickness and thus can improve a control of an operation of the word line 120. Therefore, performance of the memory device 100 can be improved.

Figure 2:
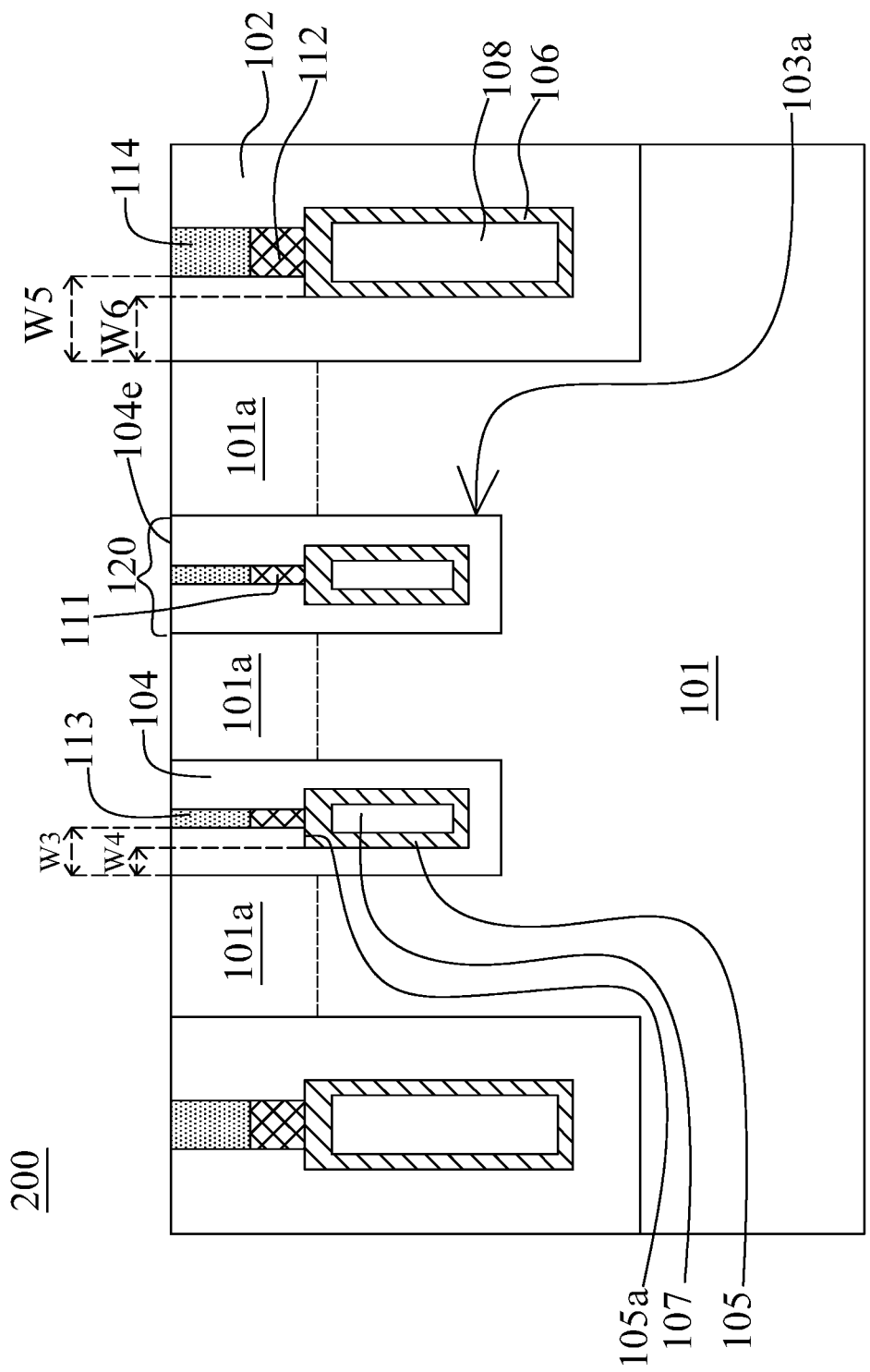
FIG. 2 is a cross-sectional side view of a memory device in accordance with other embodiments of the present disclosure.

FIG. 2 is a schematic cross-sectional side view of a memory device 200 in accordance with some embodiments of the present disclosure. The memory device 200 is similar to the memory device 100, except there is no interface within the first insulating layer 104 and the isolation structure 102 in FIG. 2. In other words, the first lining portion 104*a* and the first protruding portion 104*b* as shown in FIG. 1 are integrally formed to become the first insulating layer 104 and the isolation structure 102 respectively as shown in FIG. 2. In some embodiments, the first insulating layer 104 is at least partially disposed above the first conductive layer 105.

In some embodiments, a width W3 of the first insulating layer 104 above the first conductive layer 105 is substantially greater than a width W4 of the first insulating layer 104 surrounding the first conductive layer 105 and the first conductive member 107. In some embodiments, a width W5 of the isolation structure 102 above the second conductive layer 106 is substantially greater than a width W6 of the isolation structure 102 surrounding the second conductive layer 106 and the second conductive member 108.

Figure 3:
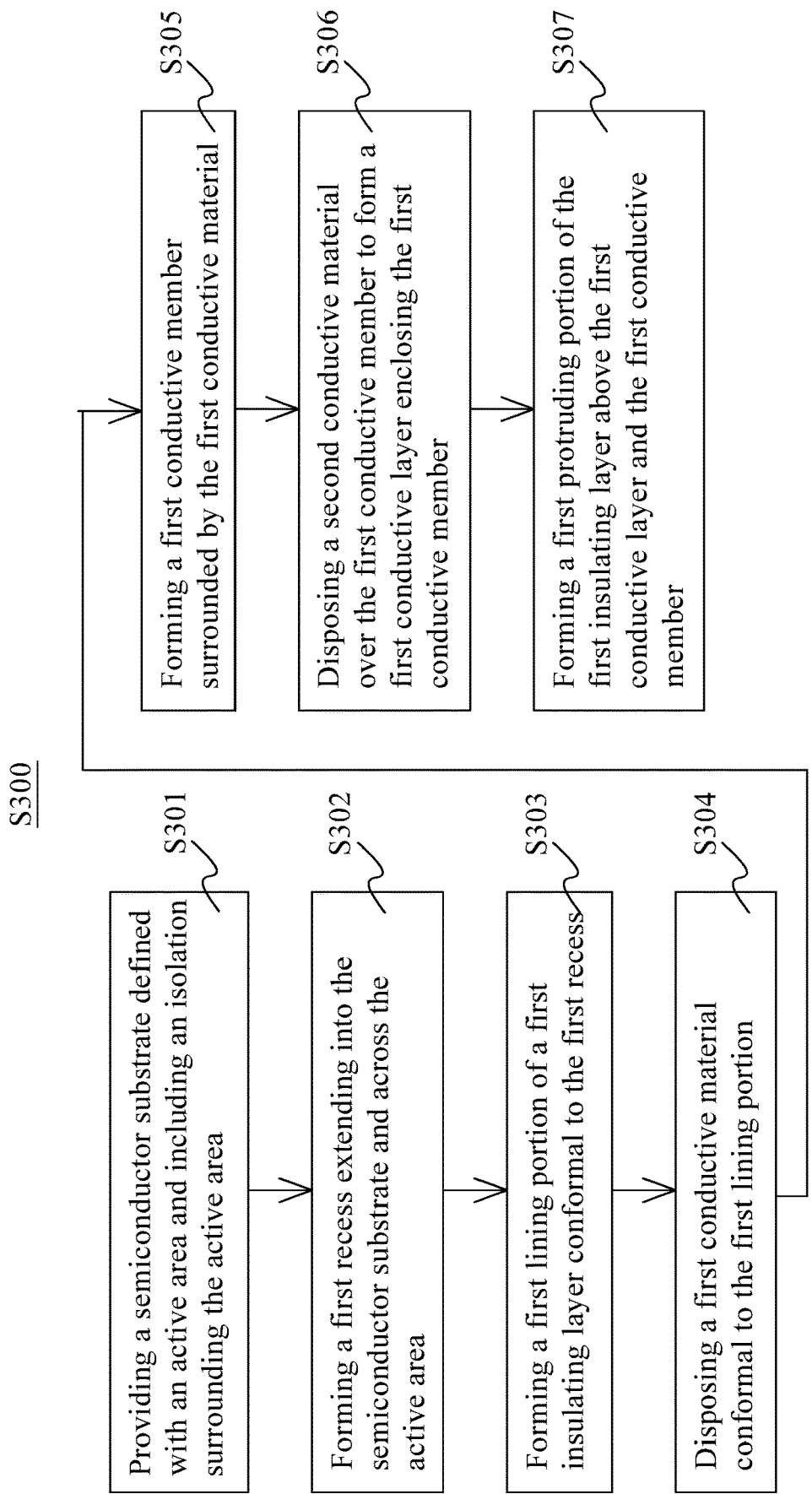
FIG. 3 is a flow diagram illustrating a method of manufacturing a memory device in accordance with some embodiments of the present disclosure.

FIG. 3 is a flow diagram illustrating a method S300 of manufacturing a memory device 100 or 200 in accordance with some embodiments of the present disclosure, and FIGS. 4 to 20 illustrate cross-sectional views of intermediate stages in formation of the memory device 100 or 200 in accordance with some embodiments of the present disclosure.

The stages shown in FIGS. 4 to 20 are also illustrated schematically in the flow diagram in FIG. 3. In following discussion, the fabrication stages shown in FIGS. 4 to 20 are discussed in reference to process steps shown in FIG. 3. The method S300 includes a number of operations, and description and illustration are not deemed as a limitation to a sequence of the operations. The method S300 includes a number of steps (S301, S302, S303, S304, S305, S306 and S307).

Figure 4:
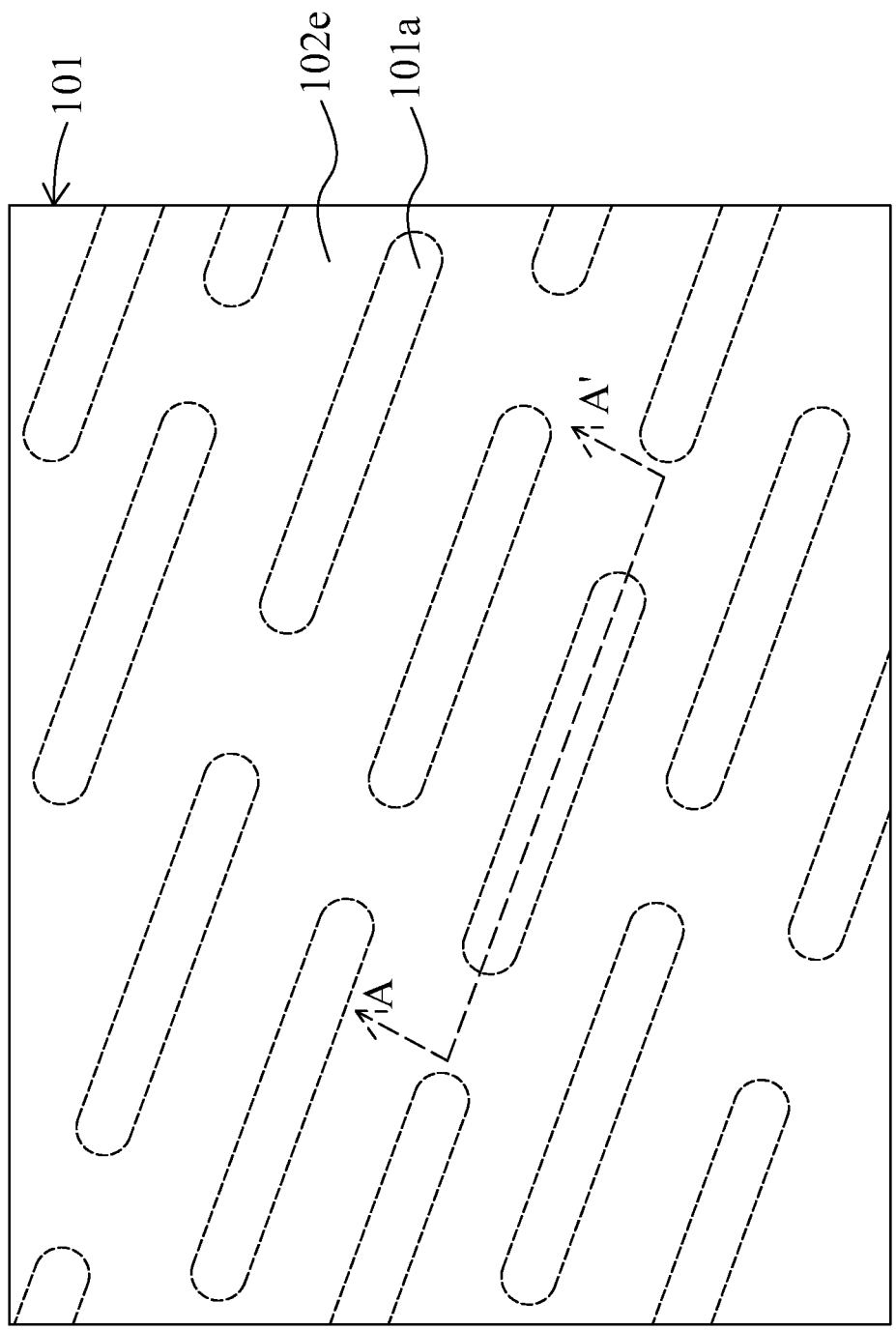
FIGS. 4 to 20 illustrate cross-sectional views of intermediate stages in the formation of a memory device in accordance with some embodiments of the present disclosure.
Figure 5:
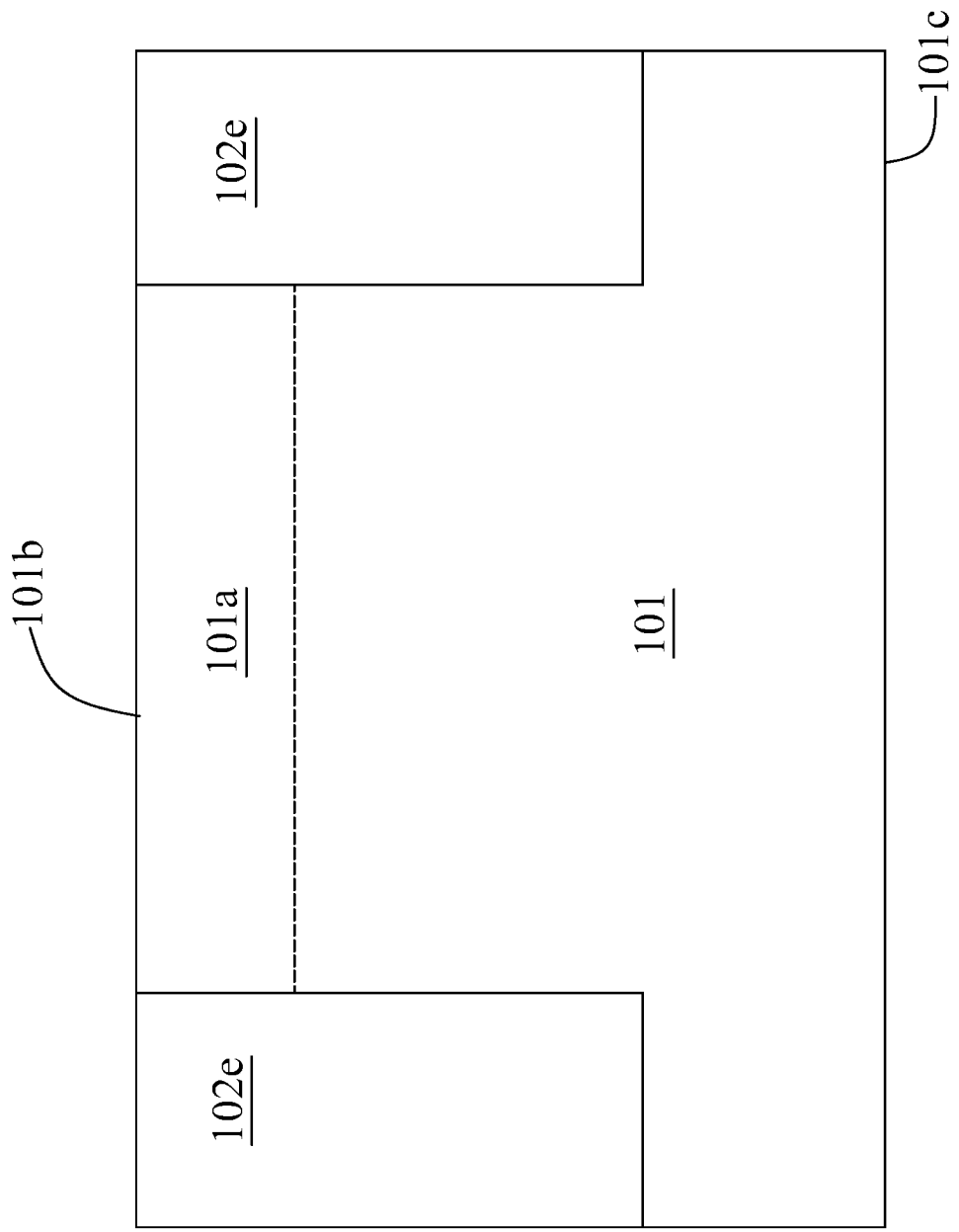

Referring to FIGS. 4 and 5, a semiconductor substrate 101 is provided according to step S301 in FIG. 3. FIG. 4 illustrates a schematic top view of the semiconductor substrate 101, and FIG. 5 illustrates a schematic cross-sectional view of the semiconductor substrate 101 along a line A-A' in FIG. 4. In some embodiments, the semiconductor substrate 101 is defined with an active area 101*a* and includes an isolation 102*e* surrounding the active area 101*a*. In some embodiments, the isolation 102*e* extends from a first surface 101*b* toward a second surface 101*c* of the semiconductor substrate 101. In some embodiments, the isolation 102*e* includes dielectric material such as oxide or the like.

Figure 6:
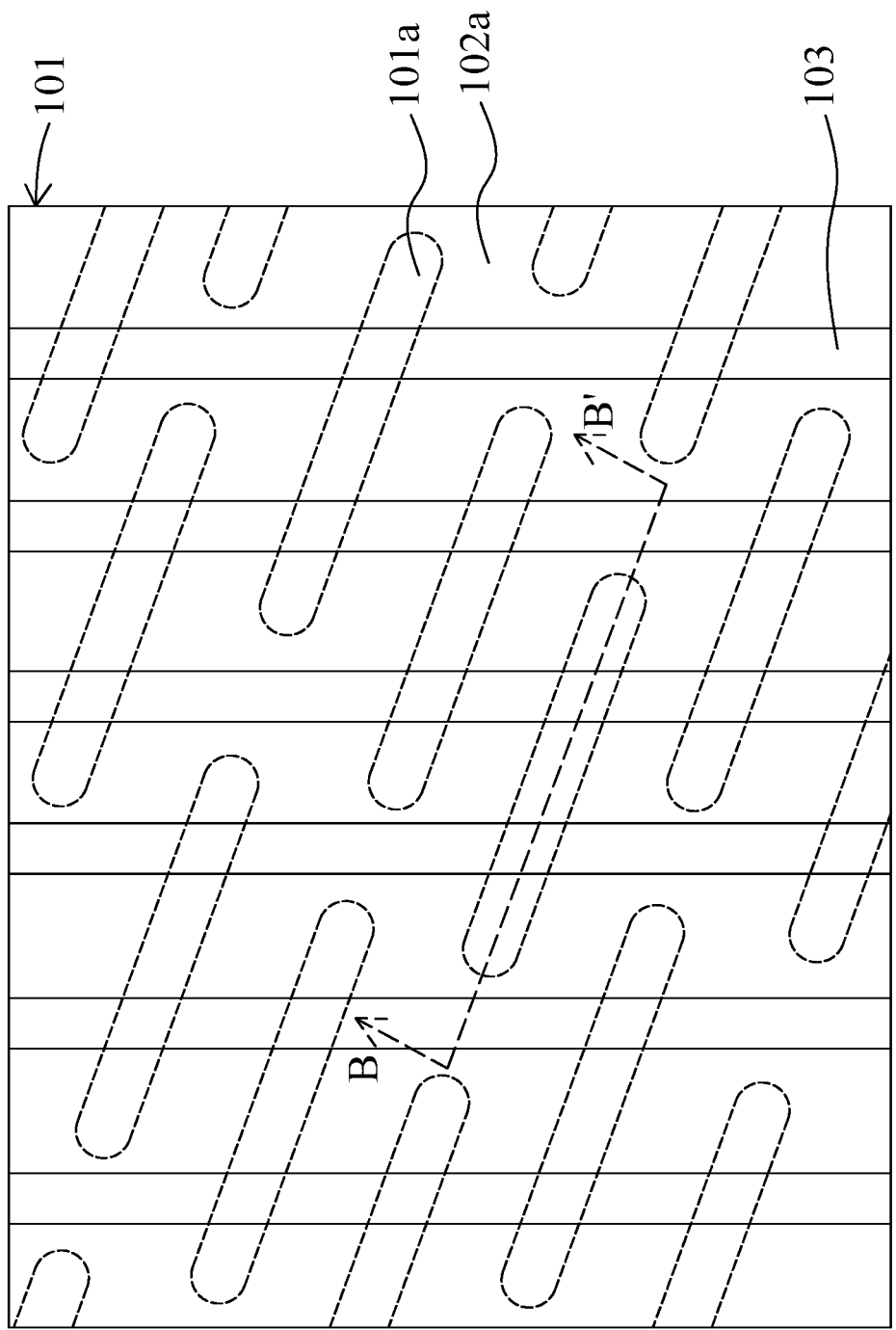
Figure 7:
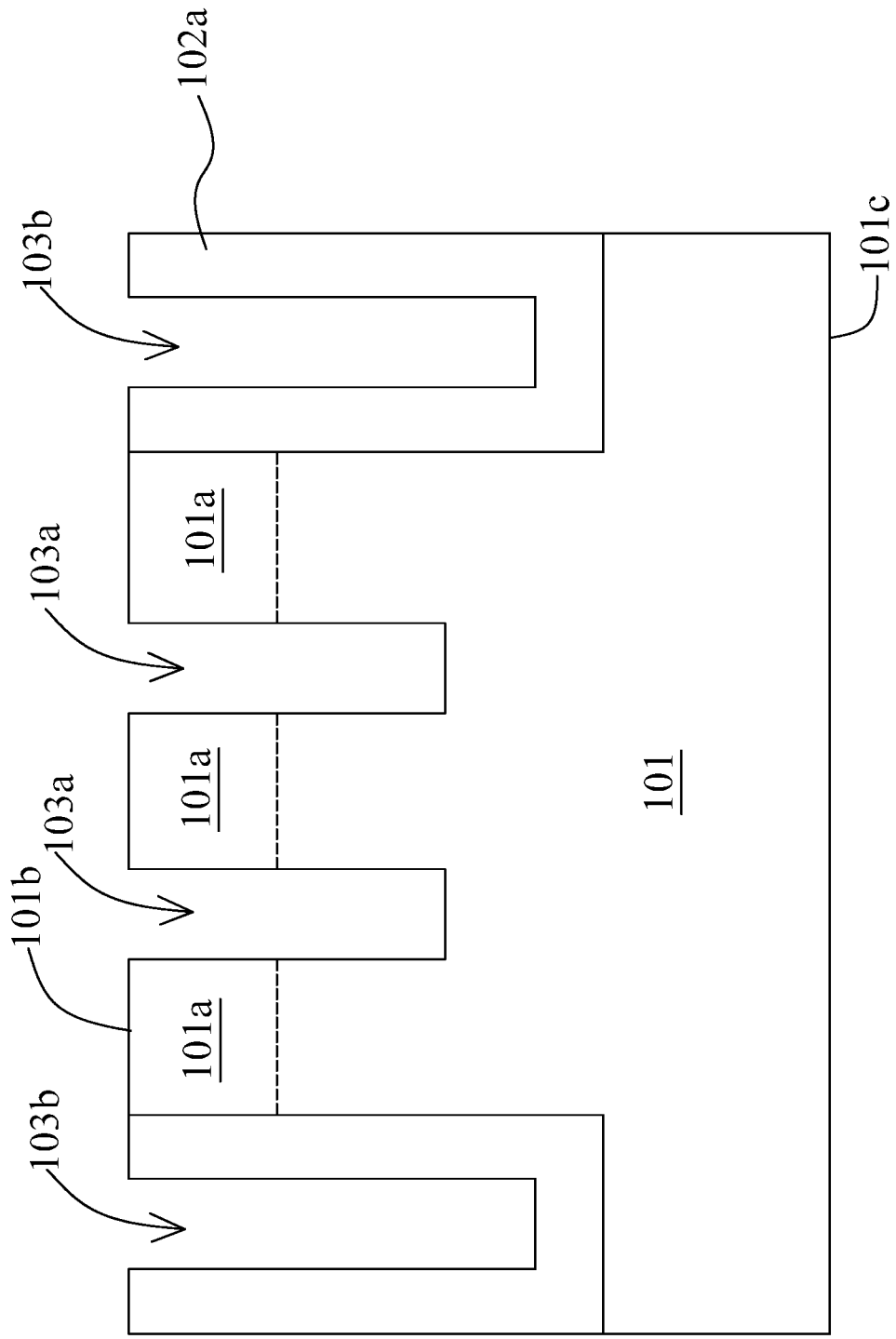

Referring to FIGS. 6 and 7, a first recess 103*a* extending into the semiconductor substrate 101 is formed according to step S302 in FIG. 3. FIG. 6 illustrates a schematic top view of the semiconductor substrate 101, and FIG. 7 illustrates a schematic cross-sectional view of the semiconductor substrate 101 along a line B-B' in FIG. 6. In some embodiments, several trenches 103 are formed across the first surface 101b of the semiconductor substrate 101. The trench 103 extends across the active area 101a or the isolation 102e (shown in FIGS. 4 and 5).

In some embodiments, the formation of the trenches 103 includes formation of the first recess 103a and formation of a second recess 103b. In some embodiments, the formation of the first recess 103a and the formation of a second recess 103b are performed separately or simultaneously. In some embodiments, the formation of the first recess 103a includes removing some portions of the semiconductor substrate 101. In some embodiments, the formation of the second recess 103b includes removing some portions of the isolation 102e.

In some embodiments, the first recess 103a extends across the active area 101a, and the second recess 103b extends across the isolation 102e. In some embodiments, the first recess 103a and the second recess 103b extend from the first surface 101b toward the second surface 101c of the semiconductor substrate 101. In some embodiments, a second lining portion 102a is formed after the formation of the second recess 103b.

Figure 8:
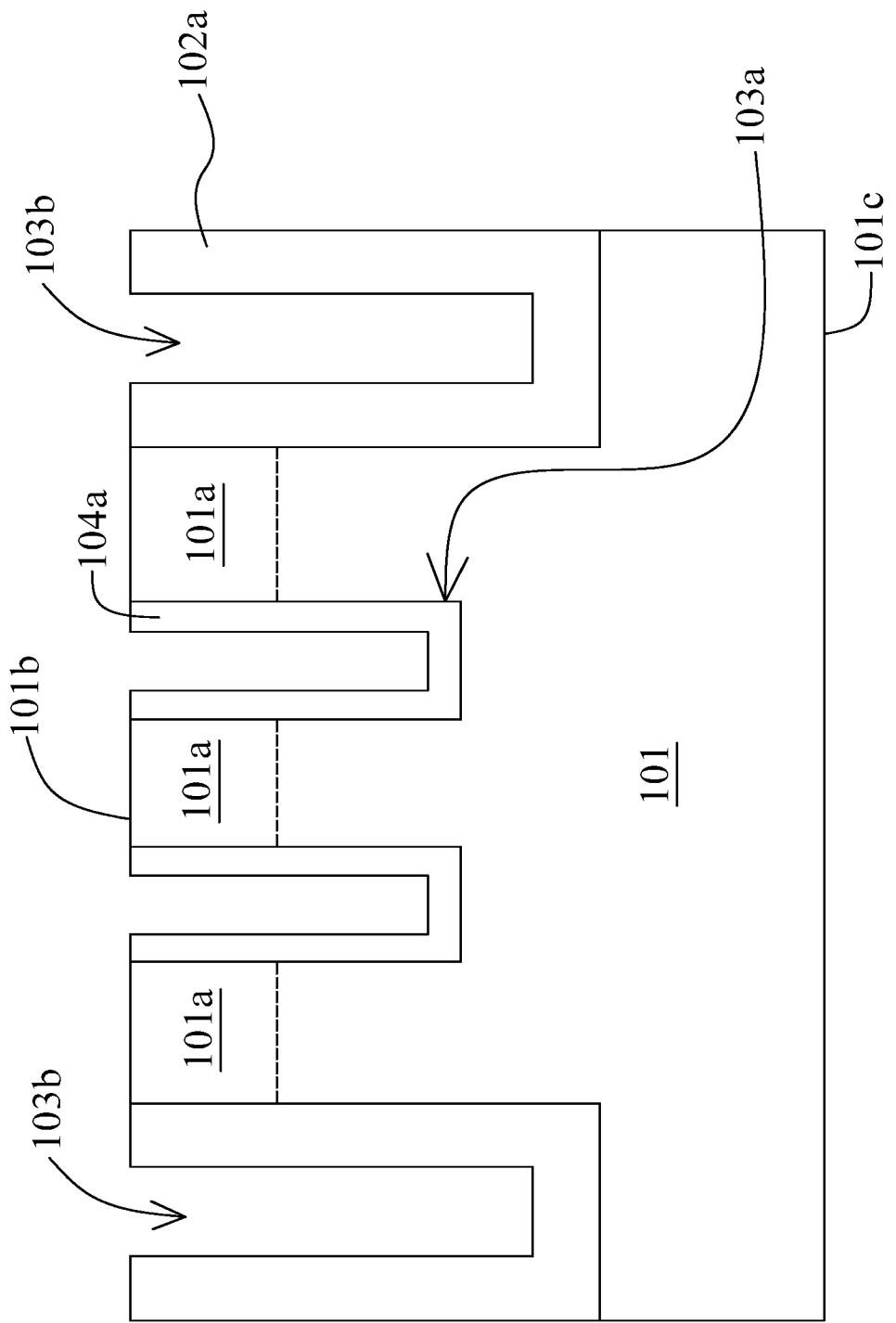

Referring to FIG. 8, a first lining portion 104a of a first insulating layer 104 conformal to the first recess 103a is formed according to step S303 in FIG. 3. In some embodiments, the first lining portion 104a is disposed within the first recess 103a. In some embodiments, the first lining portion 104a is formed by deposition, oxidation or any other suitable process. In some embodiments, the first lining portion 104a includes oxide.

Figure 9:
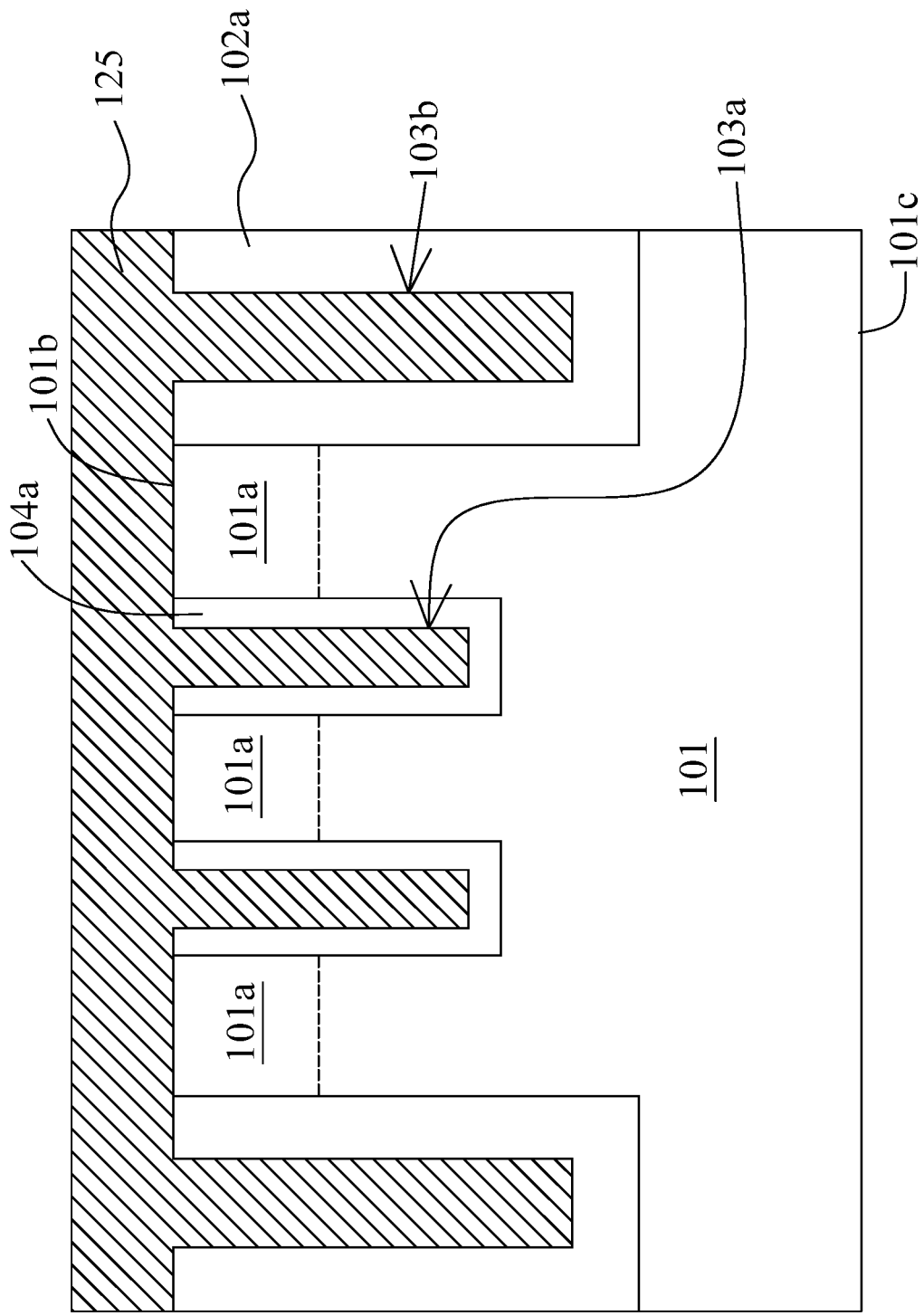
Figure 10:
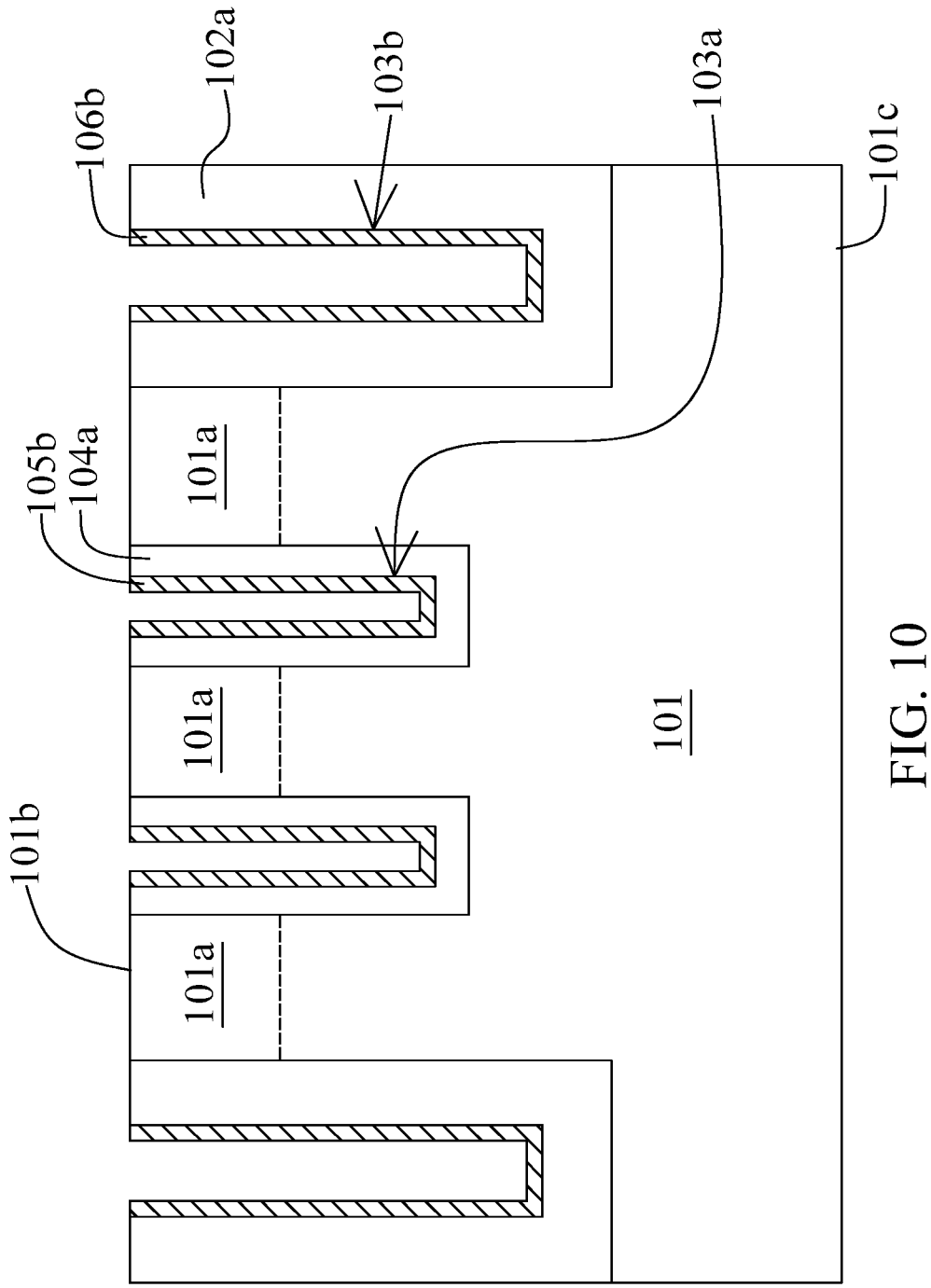

Referring to FIGS. 9 and 10, a first conductive material 105b conformal to the first lining portion 104a is disposed according to step S304 in FIG. 3. In some embodiments, a conductive material 125 is disposed over the semiconductor substrate 101 and surrounded by the first lining portion 104a and the second lining portion 102a as shown in FIG. 9, and then some portions of the conductive material 125 are removed to form the first conductive material 105b and a second conductive material 106b as shown in FIG. 10.

In some embodiments, the first conductive material 105b and the second conductive material 106b are disposed separately or simultaneously by deposition or any other suitable process. In some embodiments, the first conductive material 105b and the second conductive material 106b include titanium nitride (TiN). In some embodiments, the first conductive material 105b and the second conductive material 106b are conformal to the first lining portion 104a and the second lining portion 102a, respectively.

Figure 11:
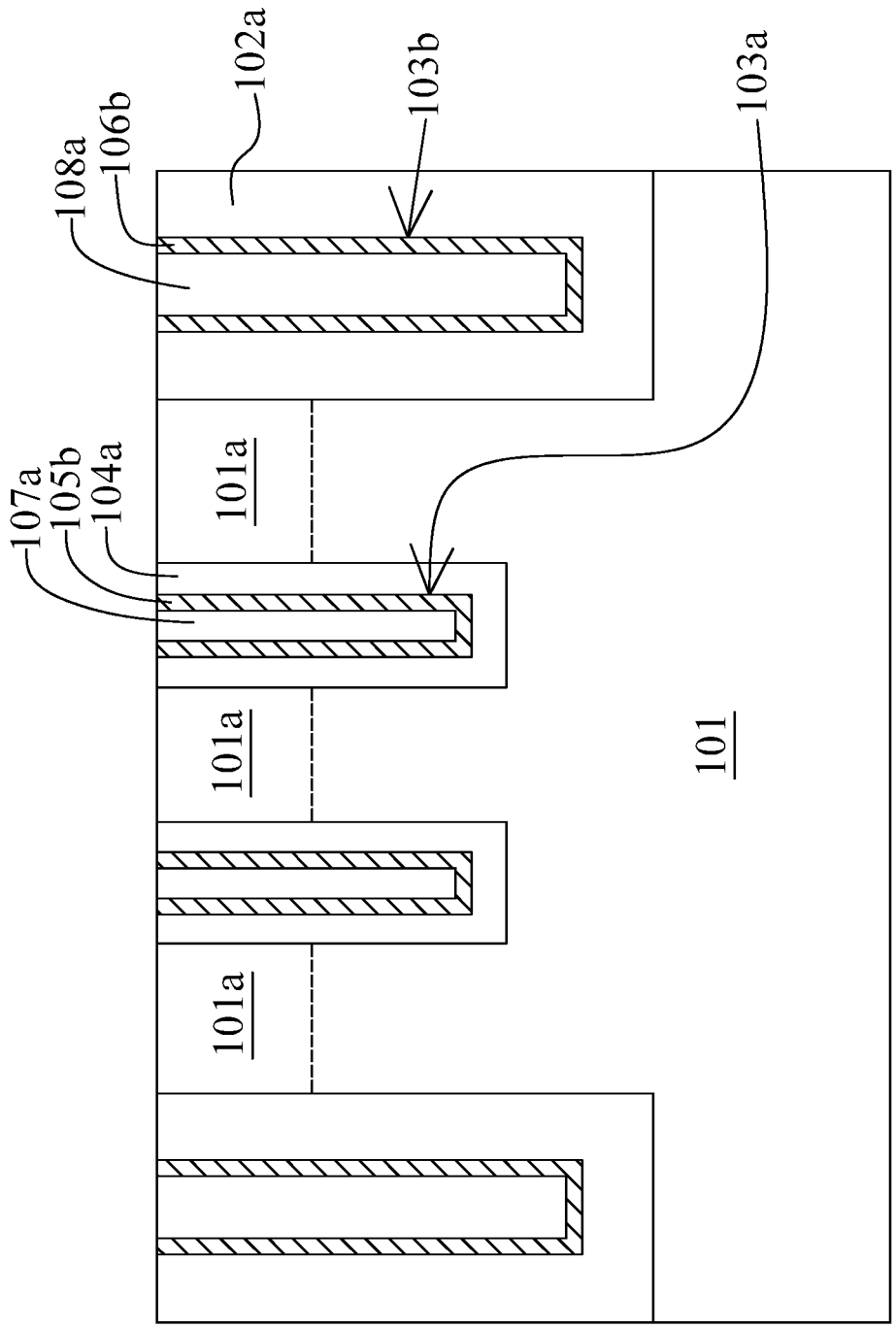
Figure 12:
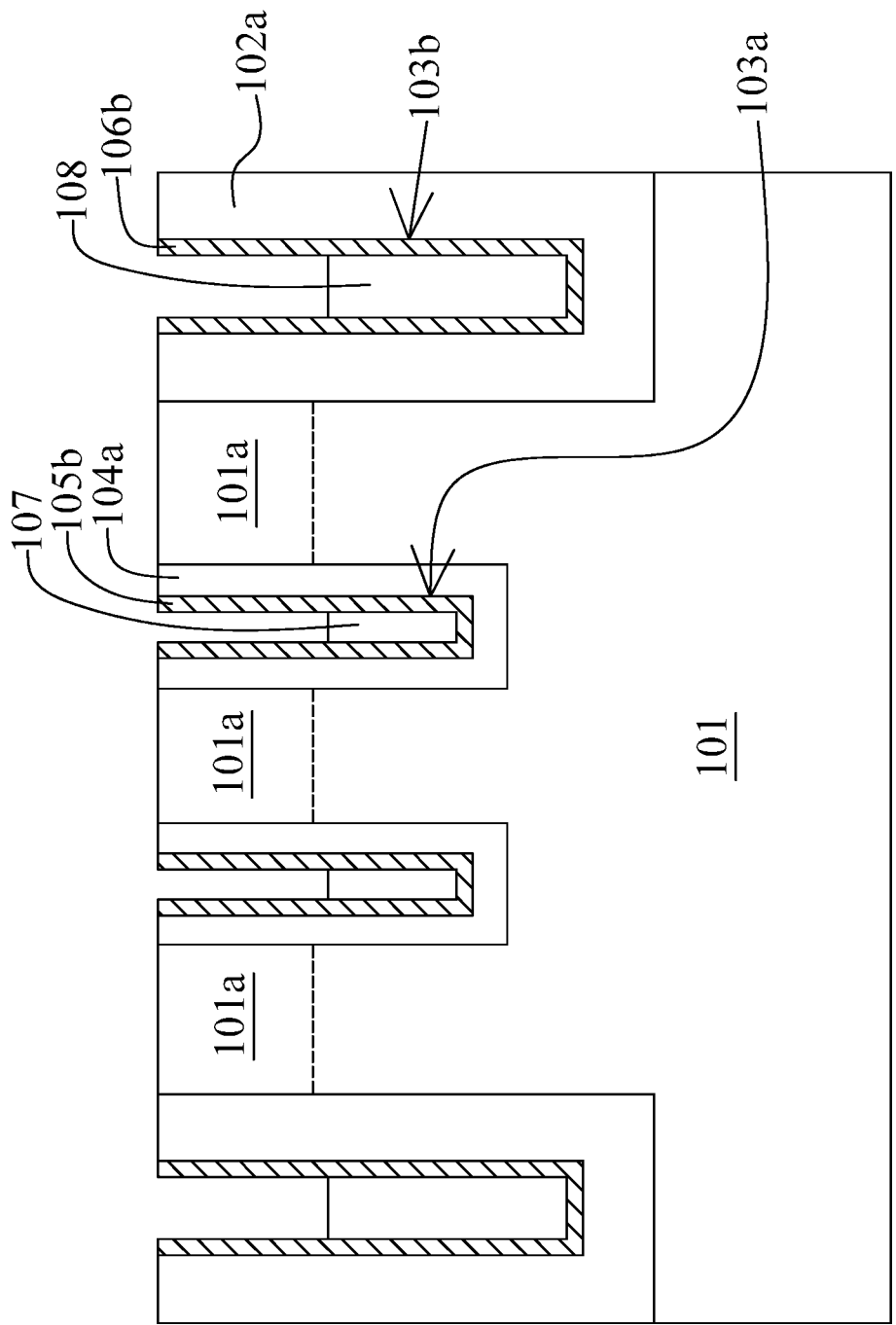

Referring to FIGS. 11 and 12, a first conductive member 107 surrounded by the first conductive material 105b is formed according to step S305 in FIG. 3. The first conductive member 107 is disposed within the first recess 103a and is surrounded by the first lining portion 104a and the first conductive material 105b. In some embodiments, the first conductive member 107 is formed by disposing a third conductive material 107a surrounded by the first conductive material 105b as shown in FIG. 11, and then removing a portion of the third conductive material 107a to become the first conductive member 107 as shown in FIG. 12.

In some embodiments, the third conductive material 107a is disposed by deposition or any other suitable process. In some embodiments, the portion of the third conductive material 107a is removed by etching or any other suitable process. In some embodiments, the third conductive material 107a includes tungsten (W).

In some embodiments, a second conductive member 108 surrounded by the second conductive material 106b is also formed. The second conductive member 108 is disposed within the second recess 103b and is surrounded by the second lining portion 102a and the second conductive material 106b. In some embodiments, the second conductive member 108 is formed by disposing a fourth conductive material 108a surrounded by the second conductive material 106b as shown in FIG. 11, and then removing a portion of the fourth conductive material 108a to become the second conductive member 108 as shown in FIG. 12.

In some embodiments, the fourth conductive material 108a is disposed by deposition or any other suitable process. In some embodiments, the portion of the fourth conductive material 108a is removed by etching or any other suitable process. In some embodiments, the fourth conductive material 108a includes tungsten (W). In some embodiments, the formation of the first conductive member 107 and the formation of the second conductive member 108 are performed separately or simultaneously.

Figure 13:
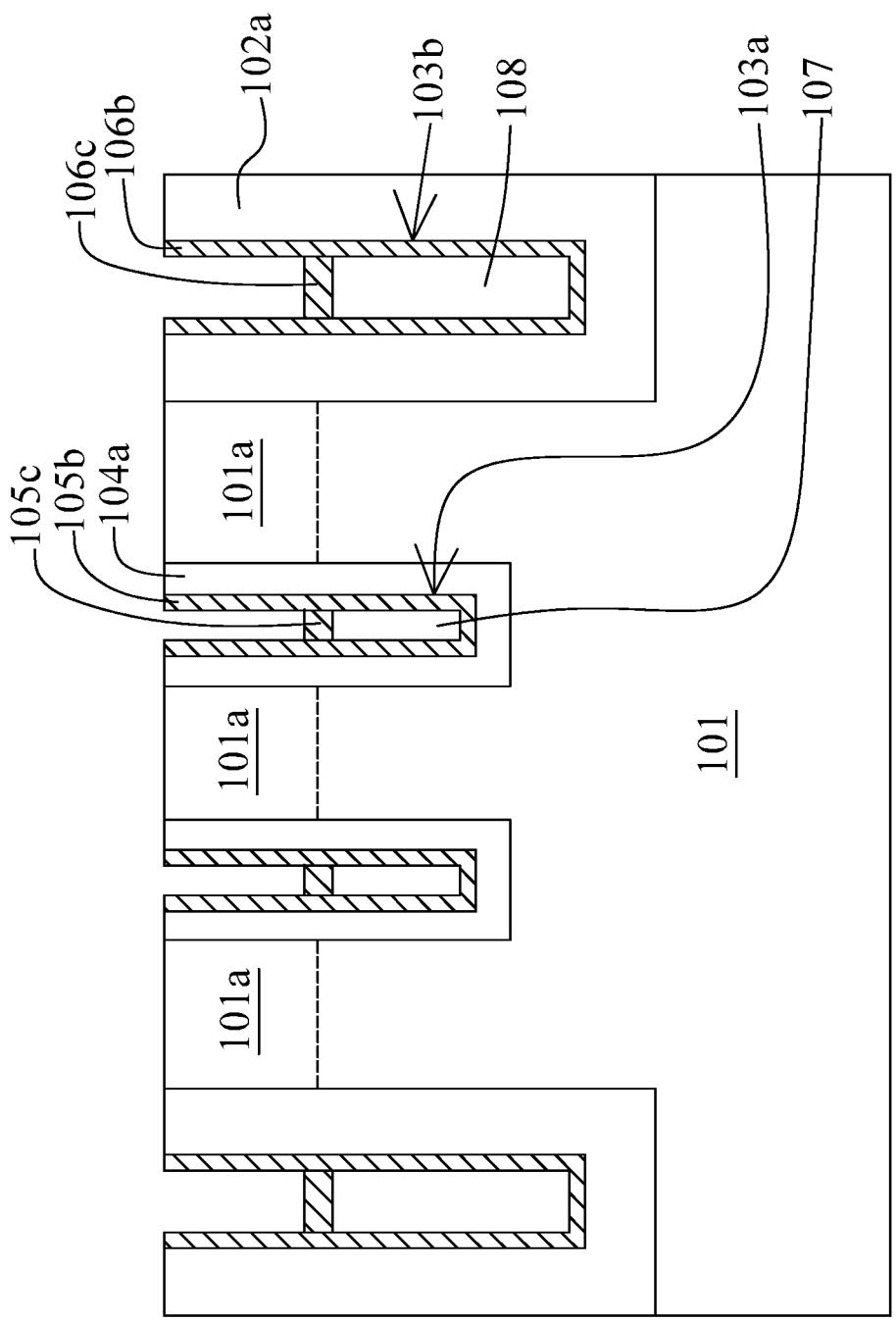
Figure 14:
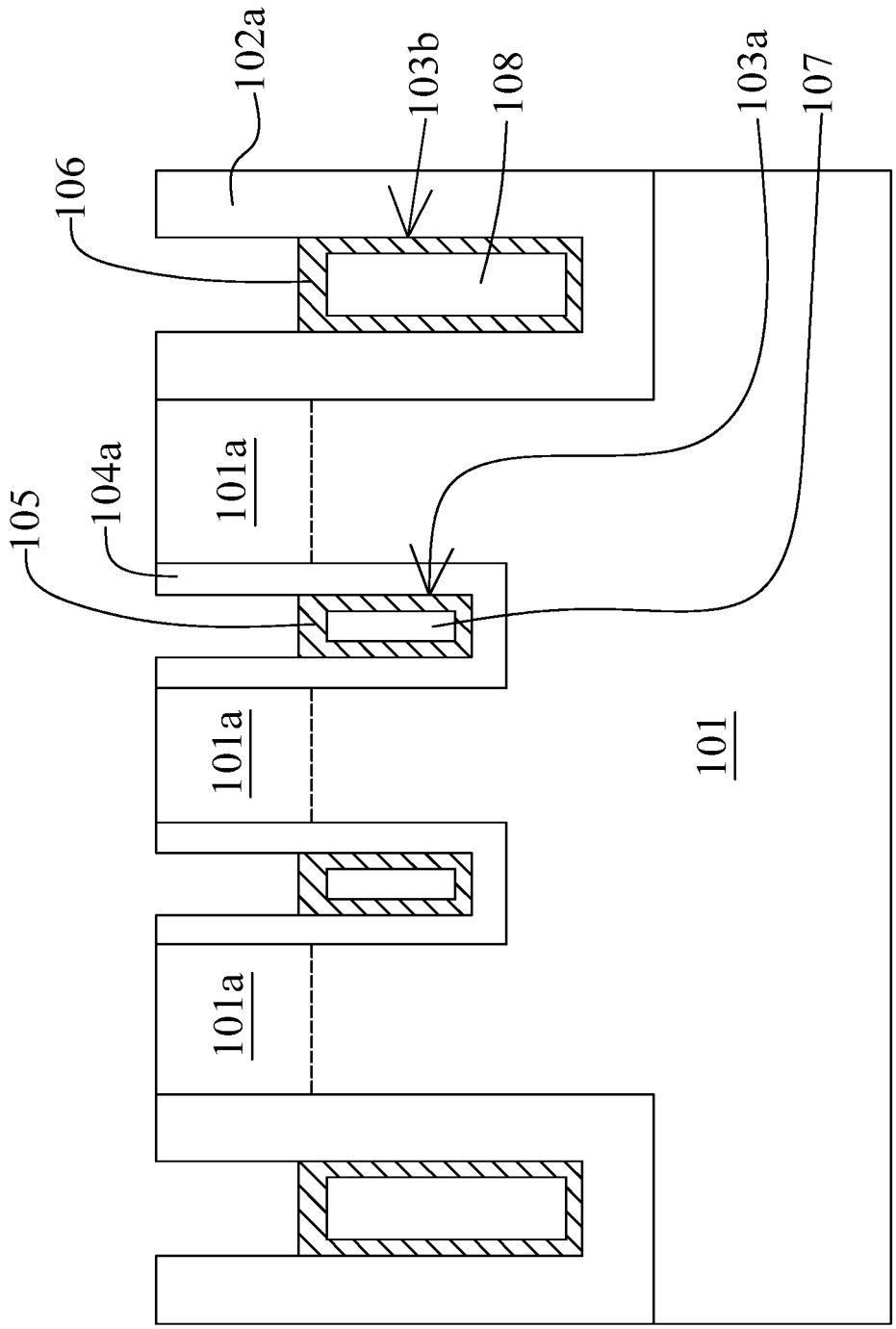

Referring to FIGS. 13 and 14, a fifth conductive material 105c is disposed over the first conductive member 107 to form a first conductive layer 105 enclosing the first conductive member 107 according to step S306 in FIG. 3. In some embodiments, the fifth conductive material 105c is disposed on the first conductive member 107 by deposition or any other suitable process. In some embodiments, the fifth conductive material 105c and the first conductive material 105b are a same material. In some embodiments, the fifth conductive material 105c includes titanium nitride (TiN).

In some embodiments, after the disposing of the fifth conductive material 105c as shown in FIG. 13, a portion of the first conductive material 105b is removed to form the first conductive layer 105 as shown in FIG. 14. In some embodiments, the portion of the first conductive material 105b is removed by etching, cleaning or any other suitable process.

In some embodiments, a sixth conductive material 106c is disposed on the second conductive member 108 by deposition or any other suitable process. In some embodiments, the sixth conductive material 106c and the second conductive material 106b are a same material. In some embodiments, the sixth conductive material 106c includes titanium nitride (TiN). In some embodiments, the first conductive material 105b, the fifth conductive material 105c, the second conductive material 106b and the sixth conductive material 106c are the same. In some embodiments, the disposing of the fifth conductive material 105c and the disposing of the sixth conductive material 106c are performed separately or simultaneously.

In some embodiments, after the disposing of the sixth conductive material 106c as shown in FIG. 13, a portion of the second conductive material 106b is removed to form the second conductive layer 106 as shown in FIG. 14. In some embodiments, the portion of the second conductive material 106b is removed by etching, cleaning or any other suitable process. In some embodiments, the removal of the portion of the first conductive material 105b and the removal of the portion of the second conductive material 106b are performed separately or simultaneously.

Figure 15:
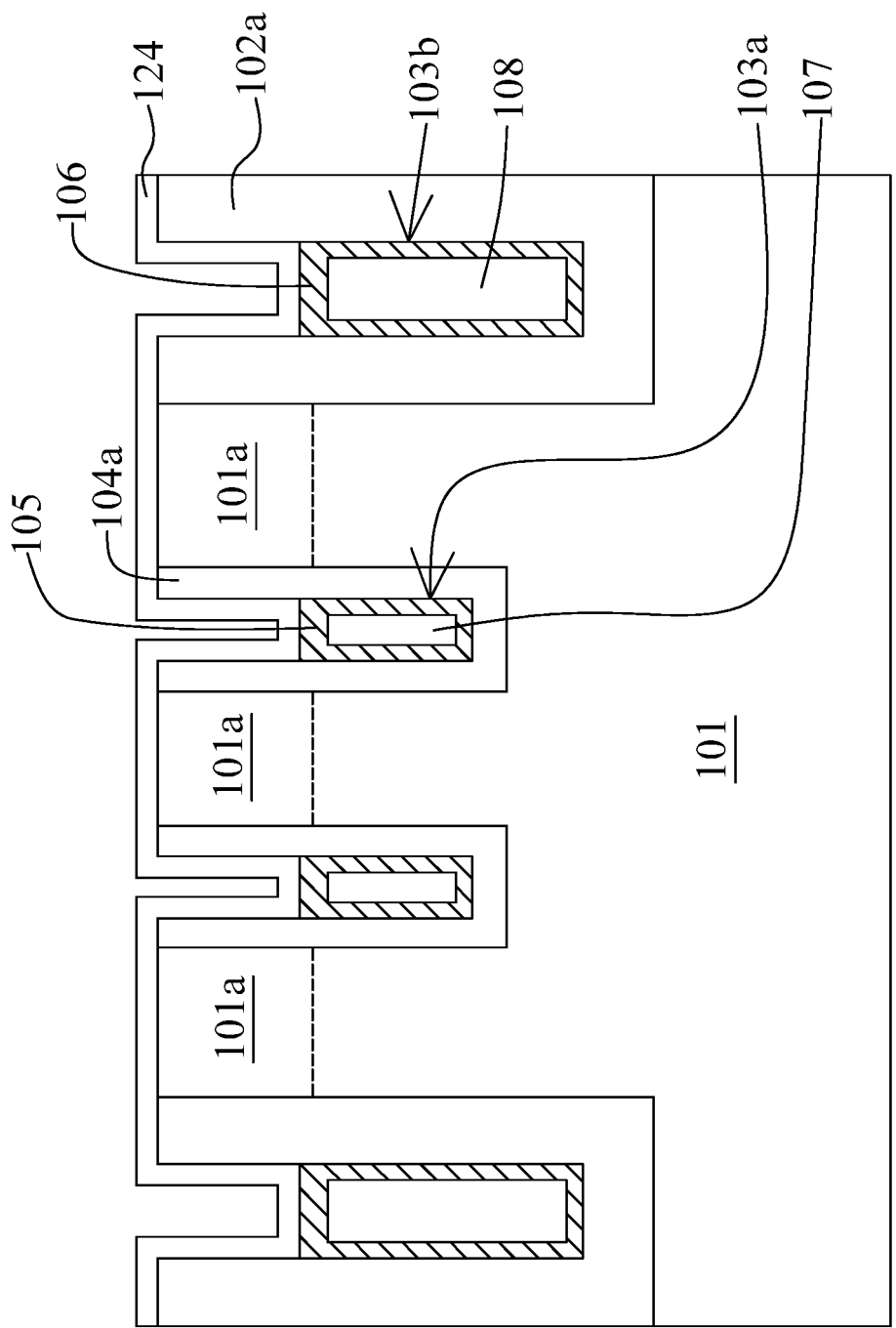
Figure 16:
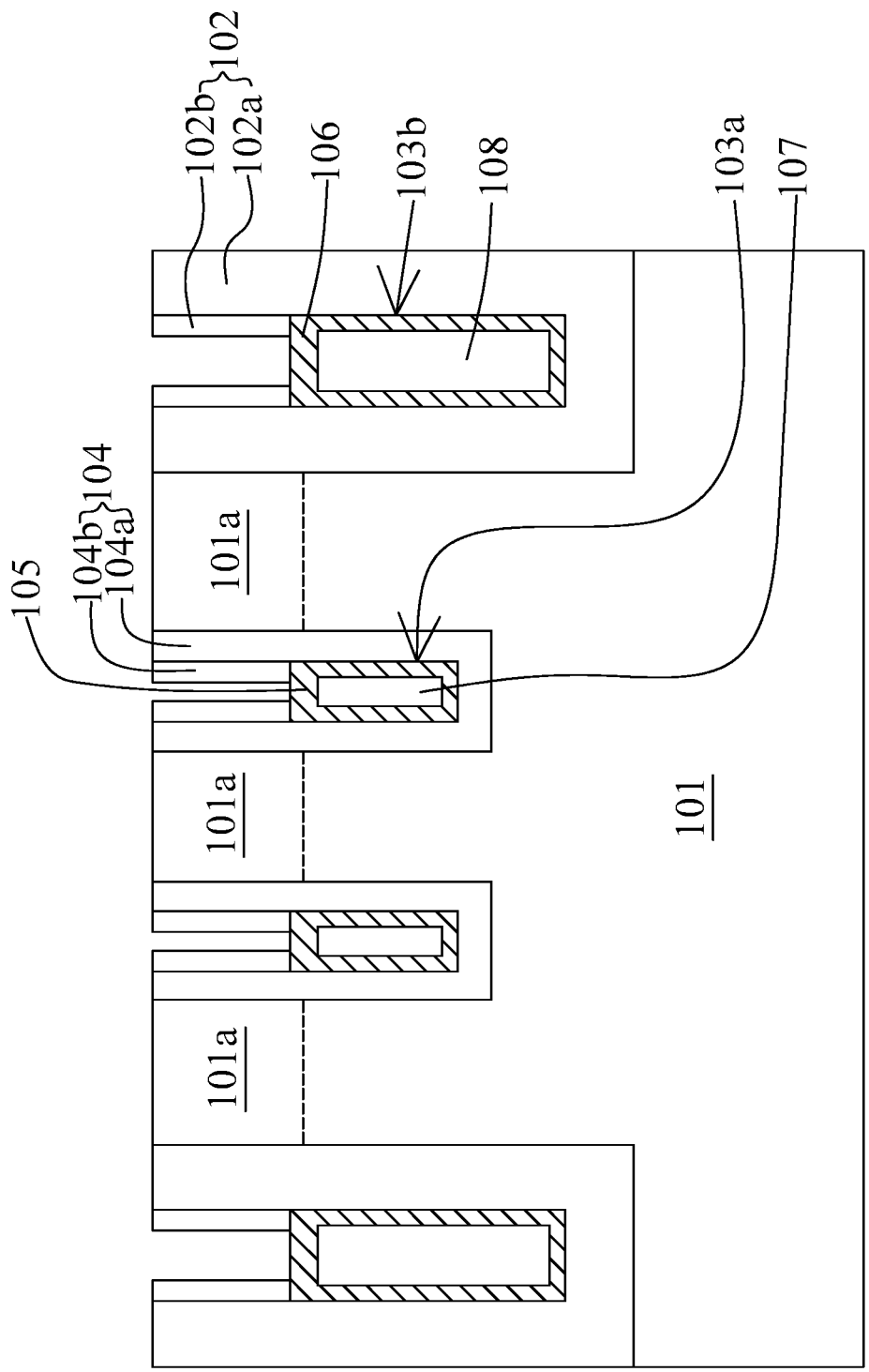

Referring to FIGS. 15 and 16, a first protruding portion 104b of the first insulating layer 104 above the first conductive layer 105 and the first conductive member 107 is formed according to step S307 in FIG. 3. In some embodiments, the formation of the first protruding portion 104b includes disposing an insulating material 124 over the semiconductor substrate 101, the first lining portion 104a, the first conductive layer 105 and the first conductive member 107. In some embodiments, the insulating material 124 is disposed by atomic layer deposition (ALD) or any other suitable process.

In some embodiments, after the disposing of the insulating material 124 as shown in FIG. 15, a portion of the insulating material 124 disposed over the semiconductor substrate 101 and the first lining portion 104a is removed to form the first protruding portion 104b. In some embodiments, the portion of the insulating material 124 is removed by anisotropic etching, planarization or any other suitable process. The first protruding portion 104b is disposed on the first conductive layer 105 and above the first conductive member 107.

In some embodiments, a second protruding portion 102b of the isolation structure 102 above the second conductive layer 106 and the second conductive member 108 is also formed. In some embodiments, the formation of the second protruding portion 102b includes disposing the insulating material 124 over the semiconductor substrate 101, the second lining portion 102a, the second conductive layer 106 and the second conductive member 108 as shown in FIG. 15, and then removing a portion of the insulating material 124 disposed over the semiconductor substrate 101 and the second lining portion 102a to form the second protruding portion 102b as shown in FIG. 16. The second protruding portion 102b is disposed on the second conductive layer 106 and above the second conductive member 108. In some embodiments, the formation of the first protruding portion 104b and the formation of the second protruding portion 102b are performed separately or simultaneously.

Figure 17:
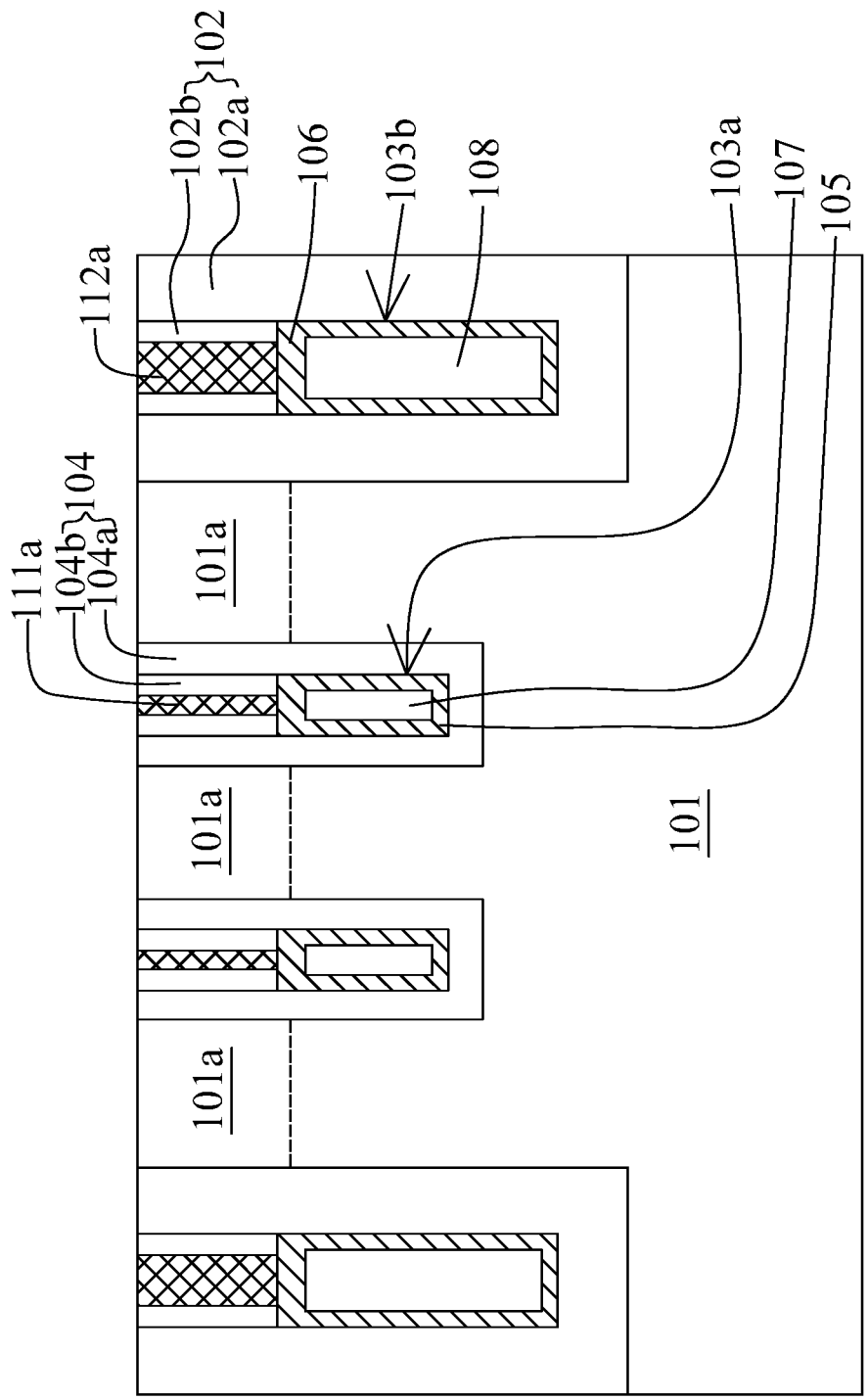
Figure 18:
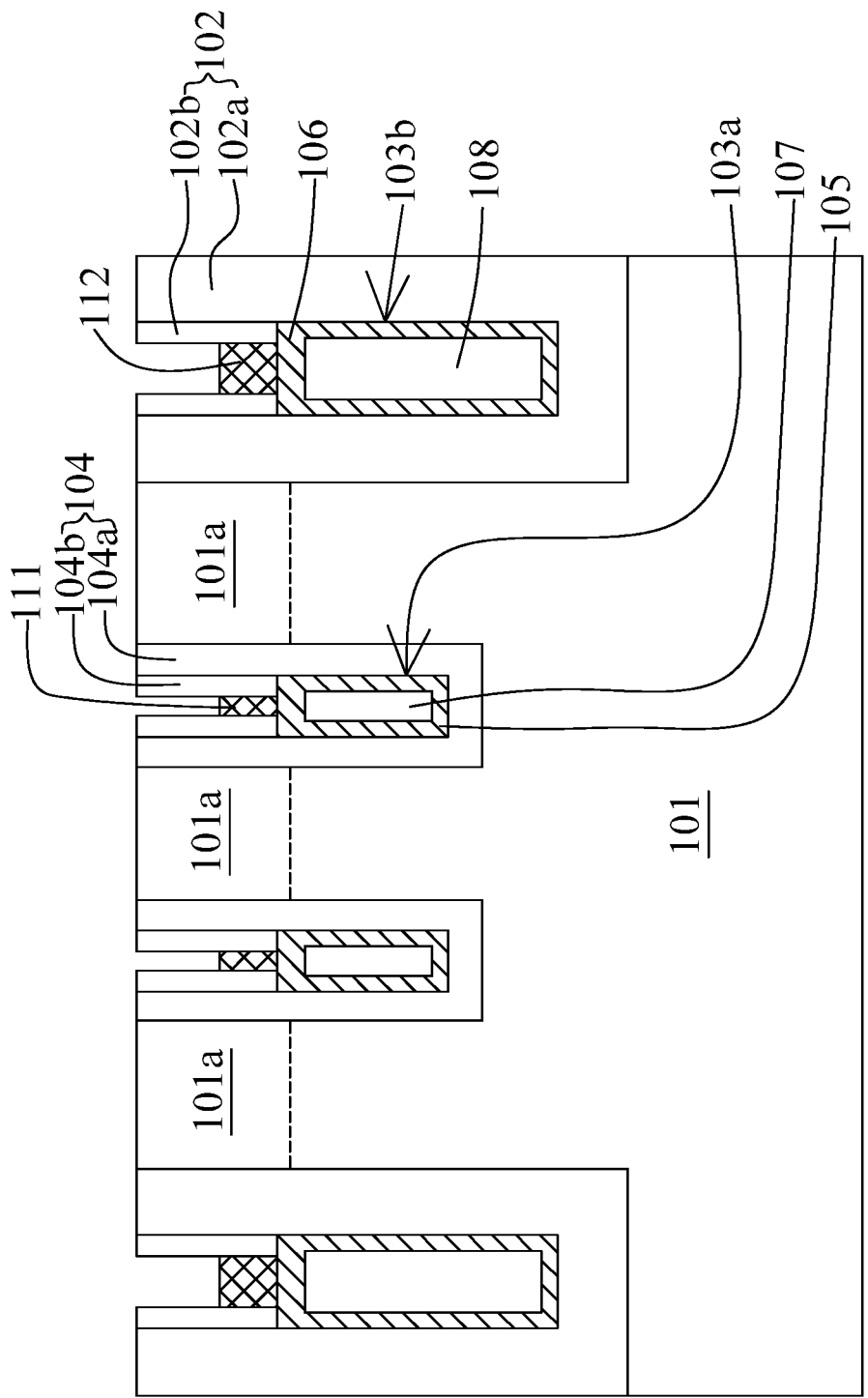

Referring to FIGS. 17 and 18, a first work function member 111 over the first conductive layer 105 and surrounded by the first protruding portion 104b is formed. In some embodiments, the first work function member 111 is formed by disposing a first work function material 111a surrounded by the first protruding portion 104b as shown in FIG. 17, and then removing a portion of the first work function material 111a to form the first work function member 111 as shown in FIG. 18. In some embodiments, the first work function material 111a is disposed by deposition, CVD or any other suitable process. In some embodiments, the portion of the first work function material 111a is removed by etching or any other suitable process.

In some embodiments, a second work function member 112 is formed by disposing a second work function material 112a surrounded by the second protruding portion 102b as shown in FIG. 17, and then removing a portion of the second work function material 112a to form the second work function member 112 as shown in FIG. 18. In some embodiments, the second work function material 112a is disposed by deposition, CVD or any other suitable process. In some embodiments, the portion of the second work function material 112a is removed by etching or any other suitable process.

In some embodiments, the disposing of the first work function material 111a and the disposing of the second work function material 112a are performed separately or simultaneously. In some embodiments, the first work function material 111a and the second work function material 112a are same. In some embodiments, the first work function material 111a and the second work function material 112a include polysilicon.

Figure 19:
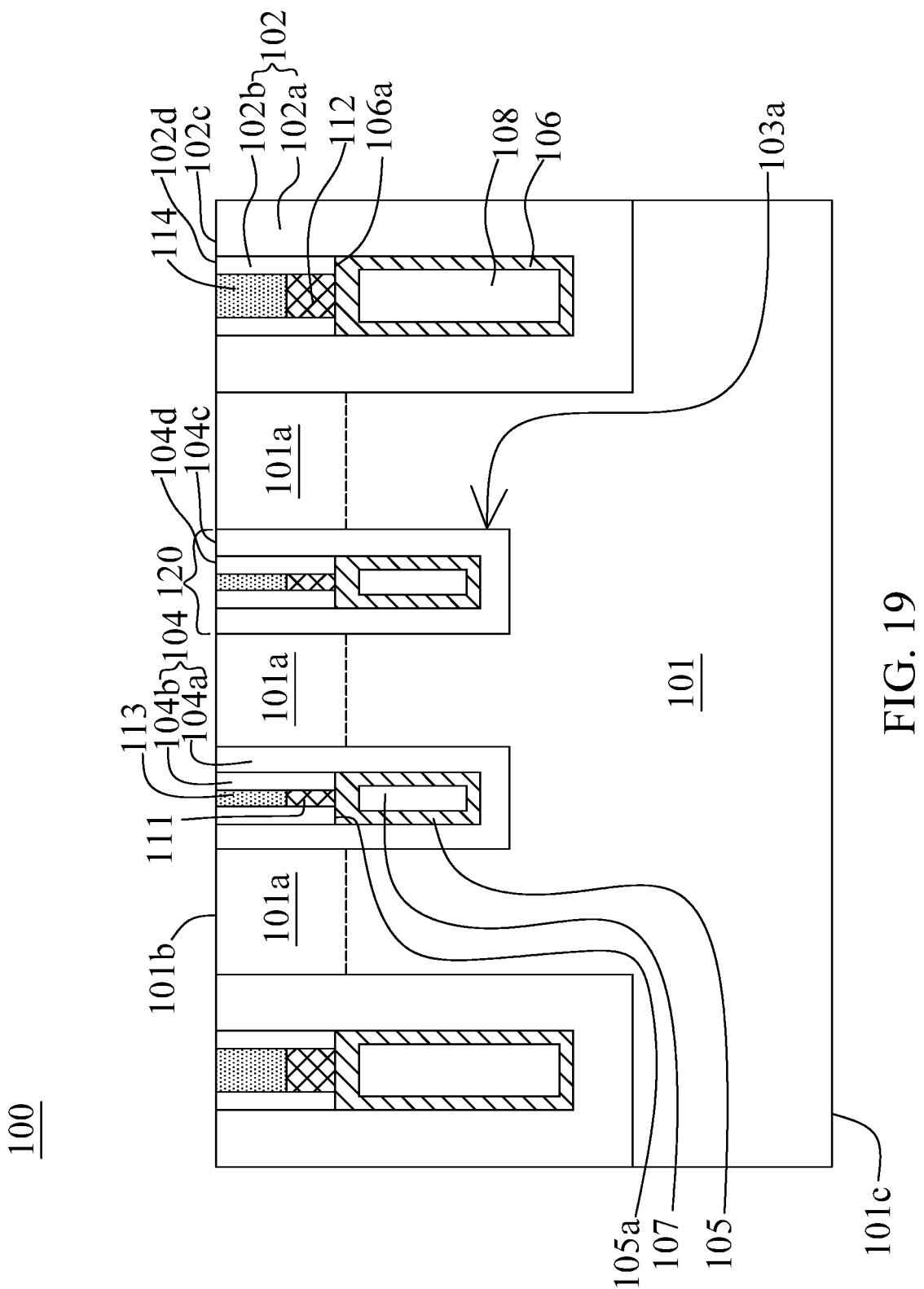
Figure 20:
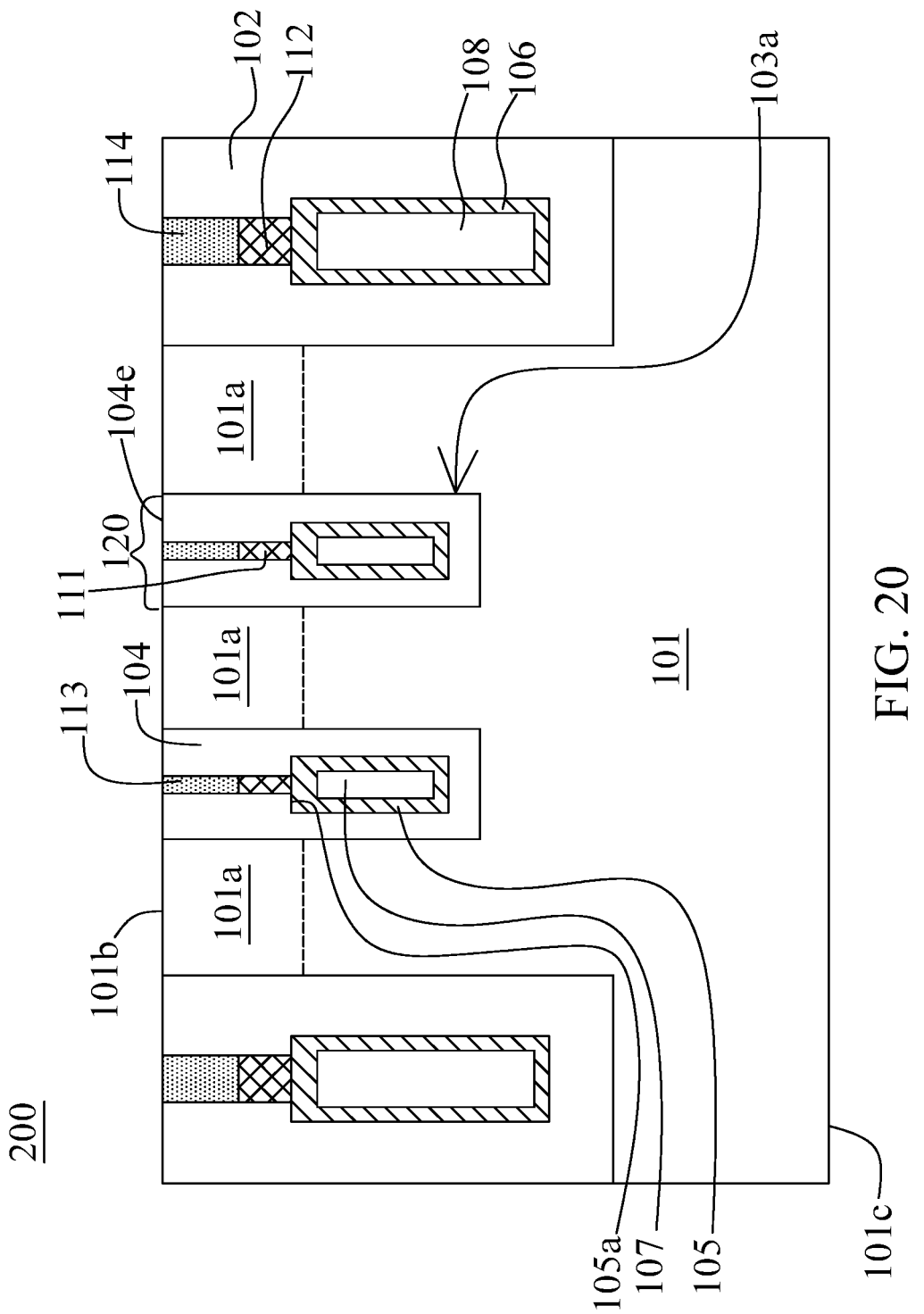

Referring to FIG. 19, a first gate insulating member 113 is formed over the first work function member 111 and surrounded by the first protruding portion 104b. In some embodiments, the formation of the first gate insulating member 113 includes disposing a gate insulating material by deposition or any other suitable process. In some embodiments, a second gate insulating member 114 is formed over the second work function member 112 and surrounded by the second protruding portion 102b. In some embodiments, the formation of the first gate insulating member 113 and the formation of the second gate insulating member 114 are performed separately or simultaneously. In some embodiments, the memory device 100 of FIG. 1 is formed as shown in FIG. 19. In some embodiments, the memory device 200 of FIG. 2 is formed as shown in FIG. 20.

In an aspect of the present disclosure, a memory device is provided. The memory device includes a semiconductor substrate defined with an active area and including a recess extending into the semiconductor substrate; and a word line disposed within the recess, wherein the word line includes an insulating layer disposed within the recess, a conductive layer surrounded by the insulating layer, and a conductive member enclosed by the conductive layer, and the insulating layer includes a lining portion conformal to the recess and a protruding portion disposed above the conductive layer.

In another aspect of the present disclosure, a memory device is provided. The memory device includes a semiconductor substrate defined with an active area and including a first recess extending into the semiconductor substrate; and a word line disposed within the first recess, wherein the word line includes a first insulating layer disposed within the first recess, a first conductive layer surrounded by the first insulating layer, and a first conductive member enclosed by the first conductive layer, and the first insulating layer is at least partially disposed above the first conductive layer.

In another aspect of the present disclosure, a method of manufacturing a memory device is provided. The method includes steps of providing a semiconductor substrate defined with an active area and including an isolation surrounding the active area; forming a first recess extending into the semiconductor substrate and across the active area; forming a first lining portion of a first insulating layer conformal to the first recess; disposing a first conductive material conformal to the first lining portion; forming a first conductive member surrounded by the first conductive material; disposing a second conductive material over the first conductive member to form a first conductive layer enclosing the first conductive member; and forming a first protruding portion of the first insulating layer above the first conductive layer and the first conductive member.

In conclusion, because an insulating layer of a word line surrounding a work function member has a greater thickness compared to the insulating layer surrounding a conductive member under the work function member, a gate-induced drain leakage (GIDL) can be suppressed. Further, the insulating layer surrounding the conductive member has a smaller thickness and thus can improve a control of an operation of the word line. Therefore, performance of the memory device and process of manufacturing of the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
    providing a semiconductor substrate defined with an active area and including an isolation surrounding the active area;
    forming a first recess extending into the semiconductor substrate and across the active area;
    forming a first lining portion of a first insulating layer conformal to the first recess;
    disposing a first conductive material conformal to the first lining portion;
    forming a first conductive member surrounded by the first conductive material;
    disposing a second conductive material over the first conductive material to form a first conductive layer enclosing the first conductive member;
    forming a first protruding portion of the first insulating layer above the first conductive layer and the first conductive member; and
    removing a portion of the first conductive material disposed above the first conductive member after the disposing of the second conductive material.

2. The method according to claim 1, wherein the formation of the first lining portion is performed prior to the formation of the first protruding portion.

3. The method according to claim 1, wherein the formation of the first protruding portion includes disposing an insulating material over the semiconductor substrate, the first lining portion, the first conductive layer and the first conductive member.

4. The method according to claim 3, wherein the insulating material is disposed by atomic layer deposition (ALD).

5. The method according to claim 3, wherein the formation of the first protruding portion includes removing a portion of the insulating material disposed over the semiconductor substrate and the first lining portion.

6. The method according to claim 5, wherein the portion of the insulating material is removed by anisotropic etching.

7. The method according to claim 1, further comprising:
    forming a second recess extending into the isolation to form a second lining portion of an isolation structure;
    forming a second conductive layer surrounded by the second lining portion;
    forming a second conductive member enclosed by the second conductive layer;
    forming a second protruding portion of the isolation structure above the second conductive layer and the second conductive member.

8. The method according to claim 7, wherein the first protruding portion and the second protruding portion are formed simultaneously.

9. The method according to claim 1, further comprising:
    forming a first work function member over the first conductive layer and surrounded by the first protruding portion;
    forming a first gate insulating member over the first work function member and surrounded by the first protruding portion.

10. The method according to claim 1, wherein the first insulating layer includes oxide.

11. The method according to claim 1, wherein the first conductive layer includes titanium nitride (TiN).

12. The method according to claim 1, wherein the first conductive member includes tungsten (W).

13. The method according to claim 1, further comprising a word line, wherein the word line includes a work function member disposed over the first conductive layer and the first conductive member, and a gate insulating member disposed over the work function member.

14. The method according to claim 13, wherein the work function member and the gate insulating member are surrounded by the first insulating layer.

15. The method according to claim 13, wherein the work function member and the gate insulating member are in contact with the first protruding portion.

16. The method according to claim 13, wherein a total width of the first conductive layer and the first conductive member is substantially equal to a total width of the first protruding portion and the work function member.

17. The method according to claim 13, wherein a total width of the first conductive layer and the first conductive member is substantially equal to a total width of the protruding portion and the gate insulating member.

18. The method according to claim 13, wherein the work function member includes polysilicon.

19. The method according to claim 13, wherein the gate insulating member includes nitride.

* * * * *